United States Patent
Han

(10) Patent No.: US 7,241,671 B2
(45) Date of Patent: Jul. 10, 2007

(54) CMOS IMAGE SENSOR AND METHOD FOR FABRICATING THE SAME

(75) Inventor: Chang Hun Han, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/319,067

(22) Filed: Dec. 28, 2005

(65) Prior Publication Data
US 2006/0138484 A1      Jun. 29, 2006

(30) Foreign Application Priority Data
Dec. 29, 2004   (KR) .................. 10-2004-0114787
Dec. 29, 2004   (KR) .................. 10-2004-0114788

(51) Int. Cl.
*H01L 21/38* (2006.01)
*H01L 21/76* (2006.01)

(52) U.S. Cl. ...................... 438/524; 438/433

(58) Field of Classification Search ........... 438/424, 438/433, 524
See application file for complete search history.

(56) References Cited

U.S. PATENT DOCUMENTS 5,801,083 A * 9/1998 Yu et al. .............. 438/424
6,979,587 B2 * 12/2005 Lee .......................... 438/57
7,005,689 B2 * 2/2006 Song et al. ............... 257/290
2005/0142775 A1 * 6/2005 Koh ........................ 438/296
2005/0179071 A1 * 8/2005 Mouli ....................... 257/291

FOREIGN PATENT DOCUMENTS

KR   10-2003-0056323        7/2003
KR      2005-062143    *   6/2005 ............... 21/76

* cited by examiner

*Primary Examiner*—Zandra V. Smith
*Assistant Examiner*—Pamela E Perkins
(74) *Attorney, Agent, or Firm*—McKenna Long & Aldridge LLP

(57) ABSTRACT

A CMOS image sensor includes a first conductive type semiconductor substrate having an active region and a device isolation region, a device isolation film formed in the device isolation region of the semiconductor substrate, a second conductive type diffusion region formed in the active region of the semiconductor substrate, and an ion implantation prevention layer formed in the vicinity of the device isolation film, including a boundary portion between the device isolation film and the second conductive type diffusion region.

11 Claims, 10 Drawing Sheets

CMOS IMAGE SENSOR AND METHOD FOR FABRICATING THE SAME

CROSS REFERENCE TO RELATED APPLICATIONS

This application claims the benefit of Korean Patent Application No. P2004-114787, filed on Dec. 29, 2004, and Korean Patent Application No. P2004-114788, filed on Dec. 29, 2004, which are both hereby incorporated by reference as if fully set forth herein.

BACKGROUND OF THE INVENTION

1. Field of the Invention

The present invention relates to a method for fabricating a complementary metal-oxide semiconductor (CMOS) image sensor, and more particularly, to a CMOS image sensor and a method for fabricating the same in which a dark current is prevented from occurring, thereby improving performance of the image sensor.

2. Discussion of the Related Art

Generally, an image sensor is a semiconductor device that converts optical images to electrical signals. Image sensors can be classified as a charge coupled device (CCD) image sensor or a CMOS image sensor.

The CCD includes a plurality of photodiodes arranged in a matrix to convert optical signals to electrical signals, a plurality of vertical charge coupled devices (VCCDs) formed between the photodiodes to transfer charges generated by the respective photodiodes in a vertical direction, a plurality of horizontal charge coupled devices (HCCDs) for transferring the charges transferred by the VCCDs in a horizontal direction, and a sensing amplifier for sensing the charges transferred in a horizontal direction to output electrical signals.

However, the aforementioned CCD has drawbacks in its fabrication process because of a complicated driving mode, high power consumption, and multistage photolithographic processes. Moreover, it is difficult for a signal processing circuit and an analog-to-digital converter to integrate on a chip of the CCD. Moreover, a slim product size is difficult to obtain.

The CMOS image sensor attempts to overcome the drawbacks of the CCD. The CMOS image sensor employs a switching mode that sequentially detects outputs of unit pixels using MOS transistors by forming the MOS transistors corresponding to the number of the unit pixels on a semiconductor substrate. The CMOS technology uses a control circuit and a signal processing circuit as peripheral circuits. The CMOS image sensor sequentially detects electrical signals of each unit pixel using the switching mode to display images by forming photodiodes and MOS transistors in the unit pixels.

The CMOS image sensor can have a low power consumption and a simple fabrication process due to the relatively small number of photolithographic process steps. Further, since the CMOS image sensor allows a control circuit, a signal processing circuit and an analog-to-digital converter to be integrated on one chip, a slim sized product can be obtained. Therefore, the CMOS image sensor is widely used for various applications, such as digital cameras and digital video cameras.

A conventional CMOS image sensor will be described with reference to FIG. 1 to FIG. 2.

FIG. 1 is a layout illustrating a unit pixel of a 3T type CMOS image sensor including three transistors. As shown in FIG. 1, the unit pixel of the 3T type CMOS image sensor includes a photodiode 20 and a transistor region 10. The transistor region 10 includes three transistors, i.e., a reset transistor Rx 120 for resetting optical charges collected in the photodiode, a drive transistor Dx 130 serving as a source follower buffer amplifier, and a select transistor Sx 140 for switching addressing.

FIG. 2 is a sectional view taken along line II—II of FIG. 1. As shown in FIG. 2, a P$^-$ type epitaxial layer 101 is formed on a P$^{++}$ type semiconductor substrate 100, and a device isolation film 103 is formed in a device isolation region formed on the a P$^-$ type epitaxial layer 101. A gate 123 is formed above a portion of the epitaxial layer 101 by interposing a gate insulating film 121 therebetween. An insulating spacer 125 is formed at both sides of the gate 123. An N$^-$ type diffusion region 131 is formed on an active region of the epitaxial layer 101 defined by the device isolation film 103, and a P$^\circ$ type diffusion region 132 is formed on the N$^-$ type diffusion region 131. A heavily doped N type diffusion region (N$^+$) and a lightly doped N type diffusion region (N$^-$) are formed. The heavily doped N type diffusion region (N$^+$) and the lightly doped N type diffusion region (N$^-$) serve as source and drain regions S/D.

However, the conventional CMOS image sensor has drawbacks in that the sensor and its charge storage ability performance deteriorates are a result of dark current.

Dark current refers to current generated by electrons moving from the photodiode to another region such that light does not enter the photodiode. The dark current is generally caused by various defects or dangling bonds generated in a portion adjacent to the surface of the semiconductor substrate, a boundary portion between the device isolation film and the P$^\circ$ type diffusion region, a boundary portion between the device isolation film and the N$^-$ type diffusion region, a boundary portion between the P$^\circ$ type diffusion region and the N$^-$ type diffusion region, the P$^\circ$ type diffusion region, and the N$^-$ type diffusion region. The dark current may cause serious problems under low illumination conditions.

Therefore, in the conventional CMOS image sensor, the P$^\circ$ type diffusion region is formed on the surface of the photodiode to reduce the dark current, particularly the dark current generated in the portion adjacent to the surface of the silicon substrate. However, the conventional CMOS image sensor is affected greatly by the dark current generated in the boundary portion between the device isolation film and the P$^\circ$ type diffusion region and the boundary portion between the device isolation film and the N$^-$ type diffusion region.

In more detail, as shown in FIG. 2, a photoresist pattern (not shown) is formed on the semiconductor substrate 100 as an ion implantation mask layer to form the N$^-$ type diffusion region 131 and the P$^\circ$ type diffusion region 132. At this time, the entire active region for the photodiode is exposed from an opening of the photoresist pattern. In this state, if impurity ions for the N$^-$ type diffusion region 131 and the P$^\circ$ type diffusion region 132 are implanted into the active region of the photodiode, the impurity ions are also implanted into the boundary portion between the active region and the device isolation film 103.

Therefore, the boundary portion between the device isolation film 103 and the N$^-$ type diffusion region 131, and the boundary portion between the device isolation film 103 and the P$^\circ$ type diffusion region 132 are damaged by ion implantation of the impurity ions, thereby causing defects. The defects cause electron-hole carriers and recombination of the electrons. As a result, the leakage current of the photodiode is increased, and the dark current of the CMOS image sensor is increased.

As described above, the conventional CMOS image sensor has a structure in which the impurity ions are implanted into the boundary portion between the device isolation film and the active region for the photodiode during ion implantation of the impurity ions for the formation of the diffusion regions of the photodiode. As a result, in the conventional CMOS image sensor, it is difficult to prevent an increase in dark current generated in the boundary portion between the device isolation film and the active region for the photodiode. This limits the performance of the CMOS image sensor.

SUMMARY OF THE INVENTION

Accordingly, the present invention is directed to a CMOS image sensor and a method for fabricating the same, which substantially obviate one or more problems that may be due to limitations and disadvantages of the related art.

The present invention provides a CMOS image sensor and a method for fabricating the same, in which a self aligned ion implantation prevention layer is formed at a sidewall of a device isolation film when the device isolation film is formed, so as to prevent ions from being implanted into a boundary of the device isolation film when a photodiode region is formed, thereby improving performance of the sensor without dark current.

Additional advantages and features of the invention will be set forth in part in the description which follows and will become apparent to those having ordinary skill in the art upon examination of the following. These and other advantages of the invention may be realized and attained by the exemplary structure particularly pointed out in the written description and claims hereof as well as the appended drawings.

To achieve these and other advantages, as embodied and broadly described herein, a CMOS image sensor according to the present invention includes a first conductive type semiconductor substrate having an active region and a device isolation region, a device isolation film formed in the device isolation region of the semiconductor substrate, a second conductive type diffusion region formed in the active region of the semiconductor substrate, and an ion implantation prevention layer formed in the vicinity of the device isolation film, including a boundary portion between the device isolation film and the second conductive type diffusion region.

The device isolation film can be a shallow trench isolation (STI) film.

The ion implantation prevention layer can be formed by implanting first conductive type impurity ions into the device isolation region. The first conductive type impurity ions can be B ions or $BF_2$ ions.

The first conductive type impurity ions can be vertically implanted into the device isolation region so that the ion implantation prevention layer formed in the vicinity of the device isolation film is thicker at a bottom than its sides.

The CMOS image sensor can further include a first conductive type epitaxial layer grown on the first conductive type semiconductor substrate.

In another aspect of the present invention, a method for fabricating a CMOS image sensor includes sequentially forming an oxide film and a nitride film on a first conductive type semiconductor substrate having an active region and a device isolation region, selectively etching the nitride film and the oxide film using a mask layer to expose the device isolation region of the semiconductor substrate and form a polymer at sides of the etched nitride and oxide films, forming a trench on a surface of the exposed semiconductor substrate using the mask layer and the polymer as masks, removing the mask layer and the polymer, forming an ion implantation prevention layer in the surface of the semiconductor substrate in which the trench is formed by implanting first conductive type impurity ions into the entire surface of the semiconductor substrate using the nitride film and the oxide film as masks, forming a device isolation film in the trench, removing the nitride film and the oxide film, and forming a second conductive type diffusion region in the active region of the semiconductor substrate to be separated from the device isolation film by the ion implantation prevention layer.

The polymer can be formed by etching the nitride film using a $CF_4$ gas. The polymer can be formed at a thickness of about 200 Å to about 500 Å.

The first conductive type impurity ions implanted to form the ion implantation prevention layer can be B ions or $BF_2$ ions. The first conductive type impurity ions can be vertically implanted into the device isolation region so that the ion implantation prevention layer formed in the vicinity of the device isolation film has a thicker bottom than sides.

The method can further include forming an oxide film in the surface of the trench, and forming a first conductive type diffusion region on the second conductive type diffusion region.

In other aspect of the present invention, a method for fabricating a CMOS image sensor can include sequentially forming an oxide film and a nitride film on a first conductive type semiconductor substrate having an active region and a device isolation region, selectively etching the nitride film and the oxide film to expose the device isolation region of the semiconductor substrate, forming spacers at sides of the nitride and oxide films, forming a trench on a surface of the exposed semiconductor substrate using the nitride film and the spacers as masks, removing the spacers, forming an ion implantation prevention layer in the surface of the semiconductor substrate in which the trench is formed by implanting first conductive type impurity ions into the entire surface of the semiconductor substrate using the nitride film and the oxide film as masks, forming a device isolation film in the trench, removing the nitride film and the oxide film, and forming a second conductive type diffusion region in the active region of the semiconductor substrate to have a constant interval from the device isolation film by the ion implantation prevention layer.

The step of forming spacers can include forming an oxide insulating film on the entire surface of the semiconductor substrate, including the nitride film, and etching back the oxide insulating film to form the spacers.

The first conductive type impurity ions implanted to form the ion implantation prevention layer can be B ions or $BF_2$ ions. The first conductive type impurity ions can be vertically implanted into the device isolation region so that the ion implantation prevention layer formed in the vicinity of the device isolation film has a thicker bottom than sides.

The method can further include forming an oxide film in a surface of the trench, and forming a first conductive type diffusion region on the second conductive type diffusion region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate exemplary embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
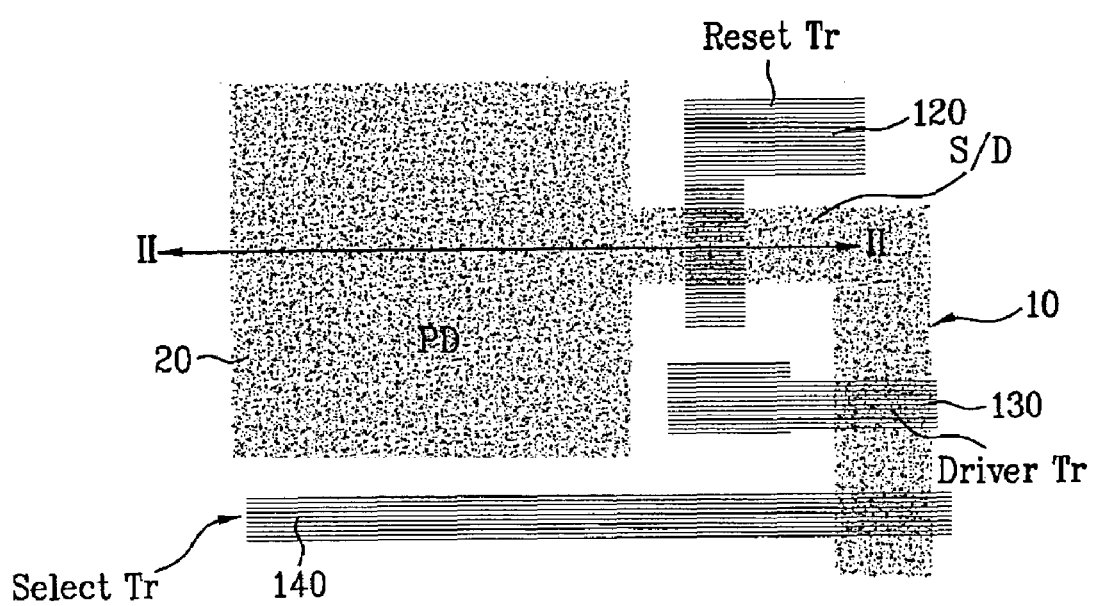
FIG. 1 is a layout illustrating a unit pixel of a 3T type CMOS image sensor.
Figure 2:
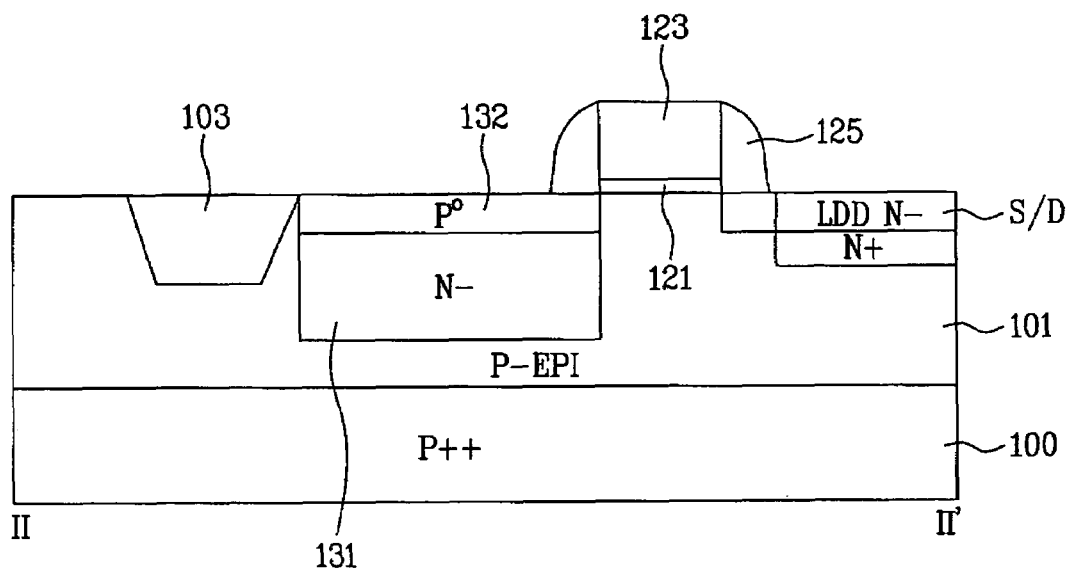
FIG. 2 is a sectional view taken along line II—II of FIG. 1, illustrating a unit pixel of a conventional CMOS image sensor.
Figure 3:
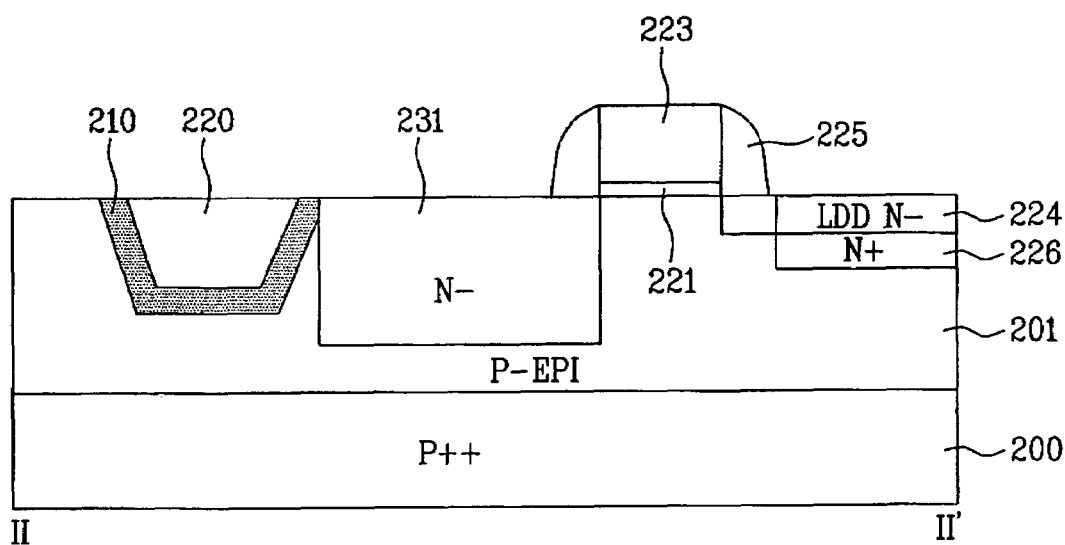
FIG. 3 is a sectional view corresponding to the view of FIG. 2, illustrating a unit pixel of a CMOS image sensor according to the present invention.

FIG. 3 is a sectional view corresponding to the view of FIG. 2, illustrating a unit pixel of a CMOS image sensor according to the present invention. As shown in FIG. 3, a P⁻ type epitaxial layer (P-EPI) 201 is formed on a P⁺⁺ type semiconductor substrate 200, and a device isolation film 220, i.e., a shallow trench isolation (STI) film, is formed in a device isolation region of the semiconductor substrate 200. A gate 223 is formed above a portion of the epitaxial layer 201 by interposing a gate insulating film 221 therebetween. An insulating spacer 225 is formed at both sides of the gate 223. An N⁻ type diffusion region 231 is formed in a photodiode region PD on the epitaxial layer 201.

Furthermore, source and drain regions S/D are formed on a surface of the semiconductor substrate 200 at one side of the gate 223. The source and drain regions S/D become a heavily doped N type diffusion region (N⁺) 226 and a lightly doped N type diffusion region (N⁻) 224.

A self aligned ion implantation prevention layer 210 is then formed at a side of the device isolation film 220 to prevent a dark current from being generated at a boundary portion between the device isolation film 220 and the N⁻ type diffusion region 231. In other words, the ion implantation prevention layer 210 is formed at the side of the device isolation film 220 so that N⁻ type ions are prevented from being implanted into the boundary portion between the device isolation film 220 and the N⁻ type diffusion region 231 when the photodiode region is formed.

Since the P⁺⁺ type semiconductor substrate 200 is formed and the photodiode region is formed by N⁻ type impurity ion implantation, the ion implantation prevention layer 210 can be formed by implanting P type impurity ions into the vicinity of the device isolation film 220. B ions or BF₂ ions can be used as impurity ions to form the ion implantation prevention layer 210.

FIG. 4A to FIG. 4H are sectional views illustrating a method for fabricating the CMOS image sensor according to the first exemplary embodiment of the present invention.

The method for fabricating the CMOS image sensor according to the first embodiment of the present invention will be described in accordance with a method for forming the device isolation film and the photodiode region in the semiconductor substrate.

Figure 4A:
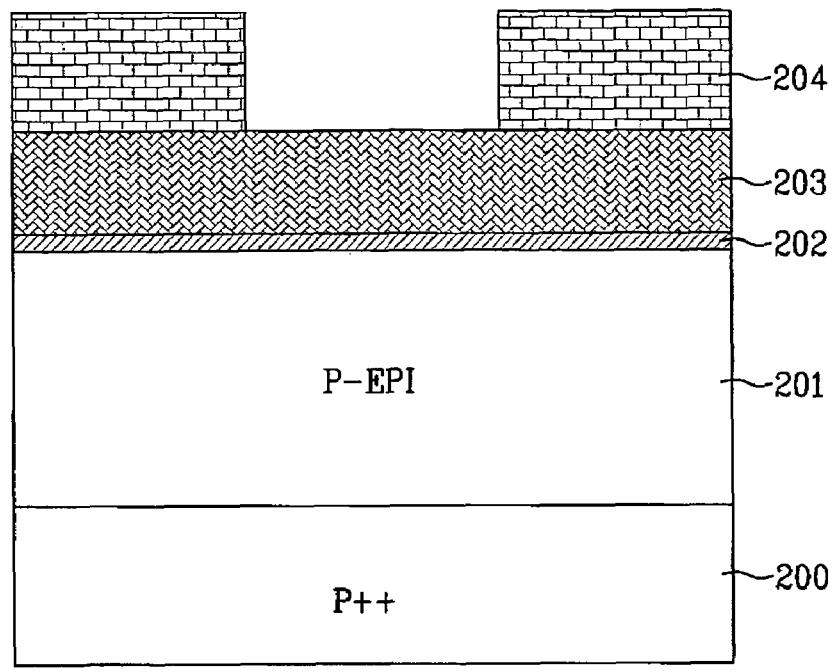
FIG. 4A to FIG. 4H are sectional views illustrating a method for fabricating a CMOS image sensor according to a first exemplary embodiment of the present invention.

As shown in FIG. 4A, a first conductive type (P⁻ type) lightly doped epitaxial layer 201 is formed on a semiconductor substrate 200 of a first conductive type (P⁺⁺ type) heavily doped monosilicon by an epitaxial process.

The epitaxial layer 201 can be formed to improve capability of a low voltage photodiode for collecting optical charges by forming a depletion region in the photodiode.

Subsequently, an oxide film 202 is formed on the semiconductor substrate 200, including the epitaxial layer 201, and a nitride film 203 is formed on the oxide film 202. Then, a photoresist 204 is coated on the nitride film 203 and patterned by exposing and developing processes to define the device isolation region.

Figure 4B:
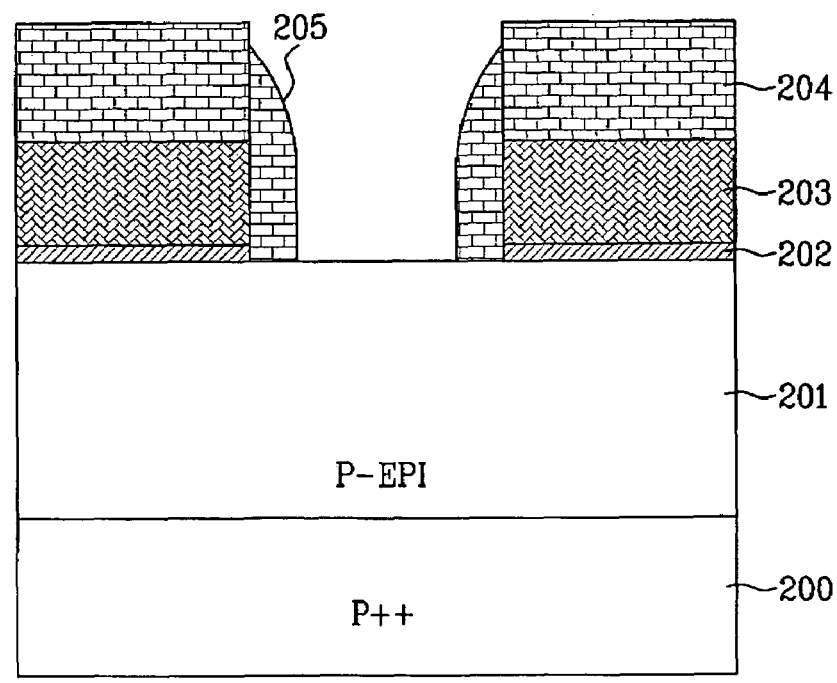

As shown in FIG. 4B, the nitride film 203 and the oxide film 202 are selectively etched using the patterned photoresist 204 as a mask to expose the surface of the semiconductor substrate 200. At this time, the nitride film 203 is etched using a CF₄ gas to generate a polymer 205 at the sides of the nitride film 203 and the oxide film 202. The polymer 205 can have a thickness of 200 Å to 500 Å.

Figure 4C:
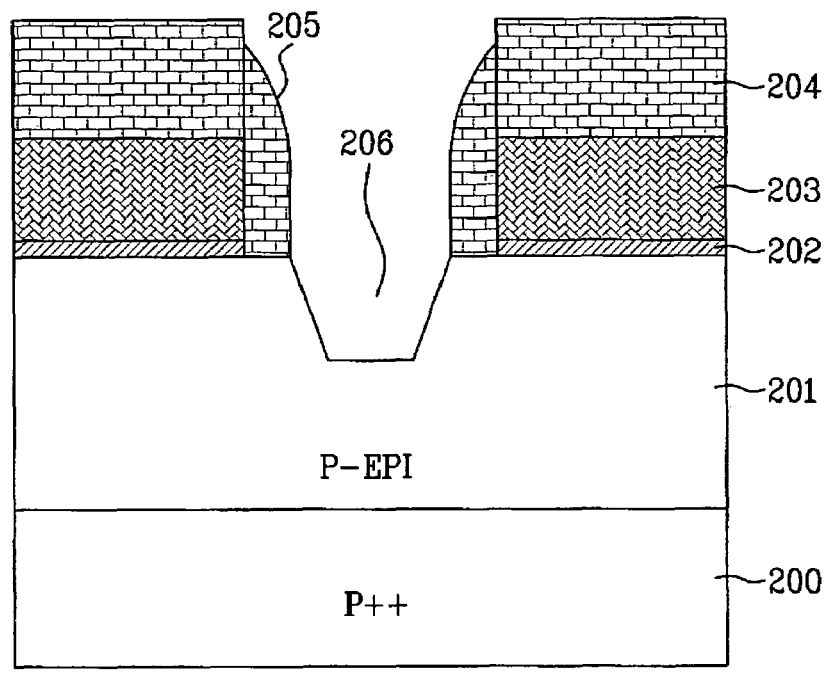

As shown in FIG. 4C, the exposed semiconductor substrate 200 is selectively etched using the patterned photoresist 204 and the polymer 205 as masks to form a trench 206 having a predetermined depth from the surface of the semiconductor substrate 200. The trench 206 is formed between the polymer 205.

Figure 4D:
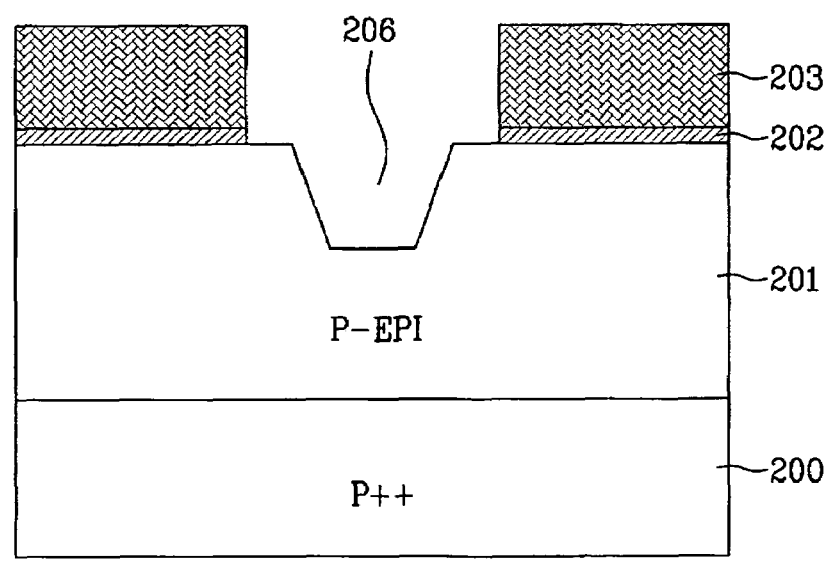
Figure 4E:
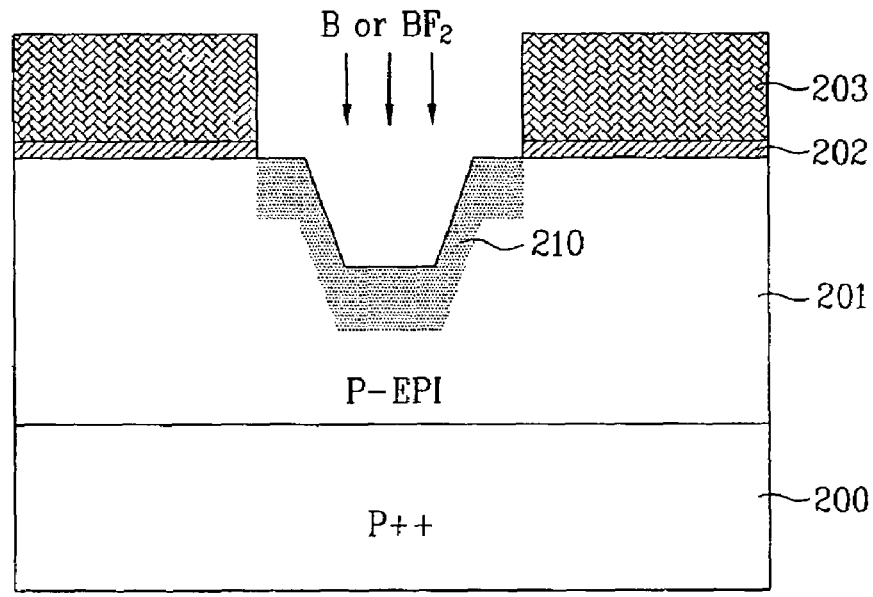

As shown in FIG. 4D, the photoresist 204 and the polymer 205 are removed. Then, as shown in FIG. 4E, B ions or BF₂ ions are vertically implanted into the entire surface of the semiconductor substrate 200 using the nitride film 203 and the oxide film 202 as masks so as to form the ion implantation prevention layer 210 in the surface of the semiconductor substrate 200 where the trench 206 is formed.

Because B ions or BF₂ ions are vertically implanted, the ion implantation prevention layer 210 formed in the vicinity of the device isolation film is thicker at the bottom than at its sides.

The ion implantation prevention layer 210 formed in the surface of the semiconductor substrate 200 is self aligned in the vicinity of the trench 206, depending on the shape of the trench 206.

In this embodiment, before B ions or BF₂ ions are vertically implanted into the surface of the semiconductor substrate, an oxide film (not shown) may be formed on the surface of the trench 206 to serve as a buffer layer during impurity ion implantation. In this case, the oxide film serving as the buffer layer prevents the semiconductor substrate 200 from being damaged. Also, the corner of the device isolation film may be rounded to reduce leakage current.

Figure 4F:
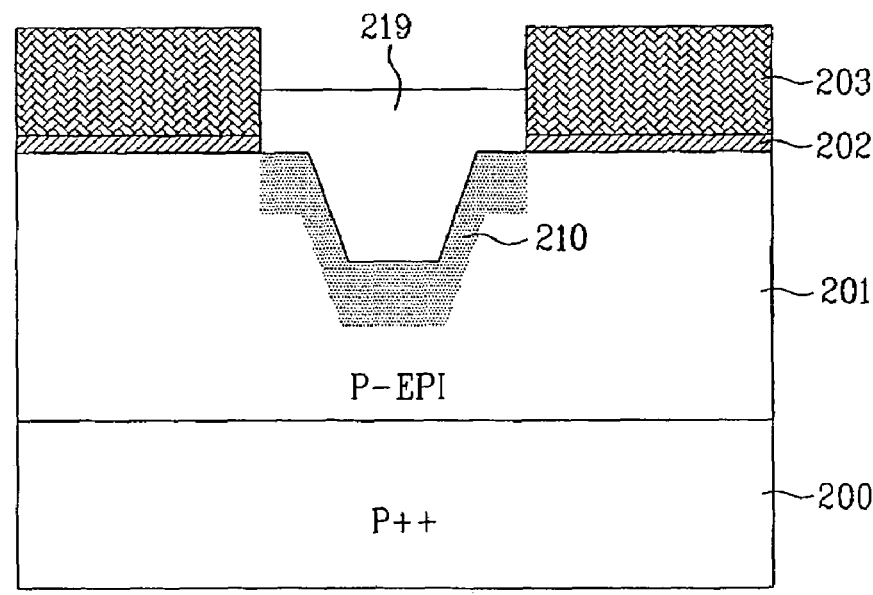

As shown in FIG. 4F, an insulating film of spin on glass (SOG) type or undoped silicate glass (USG) type is deposited on the entire surface of the semiconductor substrate 200 including the trench 206. Subsequently, a device isolation film 219 is formed in the trench 206 by performing a chemical mechanical polishing (CMP) process or an etch-back process on the entire surface of the semiconductor substrate.

Figure 4G:
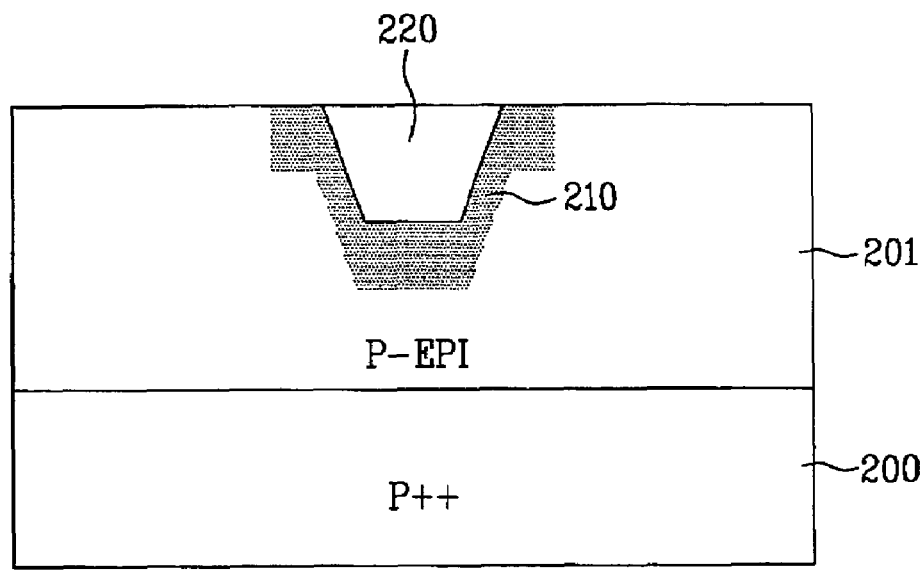

As shown in FIG. 4G, the nitride film 203 and the oxide film 202 are removed, and cleaning and planarizing processes are performed to form a device isolation film 220 to be provided in the trench 206.

Figure 4H:
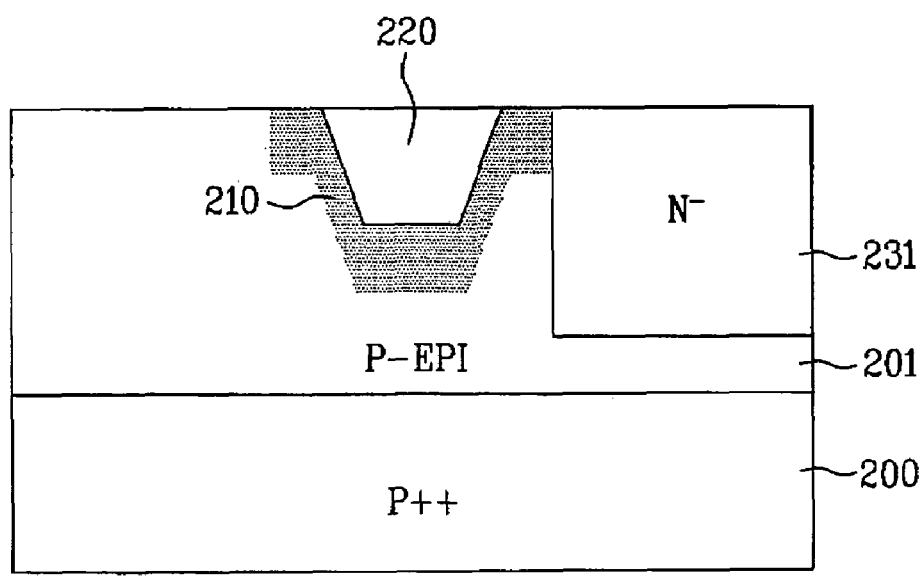

Next, as shown in FIG. 4H, a photoresist (not shown) is coated on the semiconductor substrate 200 and then patterned by exposing and developing processes to open the photodiode region. N⁻ type impurity ions are implanted into the semiconductor substrate 200 using the patterned photoresist as a mask to form the N⁻ type diffusion region 231 in the photodiode region.

When the N⁻ type diffusion region 231 is formed by the aforementioned processes, the ion implantation prevention layer 210 is formed between the N⁻ type diffusion region 231 and the device isolation film 220. Therefore, it is possible to reduce dark current generated in the boundary portion between the N⁻ type diffusion region 231 and the device isolation film 220.

Although not shown, each gate is formed in the active region of the semiconductor substrate 200 by interposing a gate insulating film before the N⁻ type diffusion region 231 is formed.

Additionally, a P⁰ type diffusion region (not shown) may further be formed on the N⁻ type diffusion region 231 to reduce the dark current generated between the surface of the semiconductor substrate 200 and the photodiode region.

In the first embodiment of the present invention, although the nitride film 203 is etched using the $CF_4$ gas to form the polymer 205, spacers may be formed at sides of the etched nitride film and the etched oxide film by an etch-back process after an oxide insulating film is formed in the etched nitride film and the etched oxide film, as described in more detail with reference to FIG. 5A to FIG. 5G, which illustrate a method for fabricating a CMOS image sensor according to the second embodiment of the present invention.

Figure 5A:
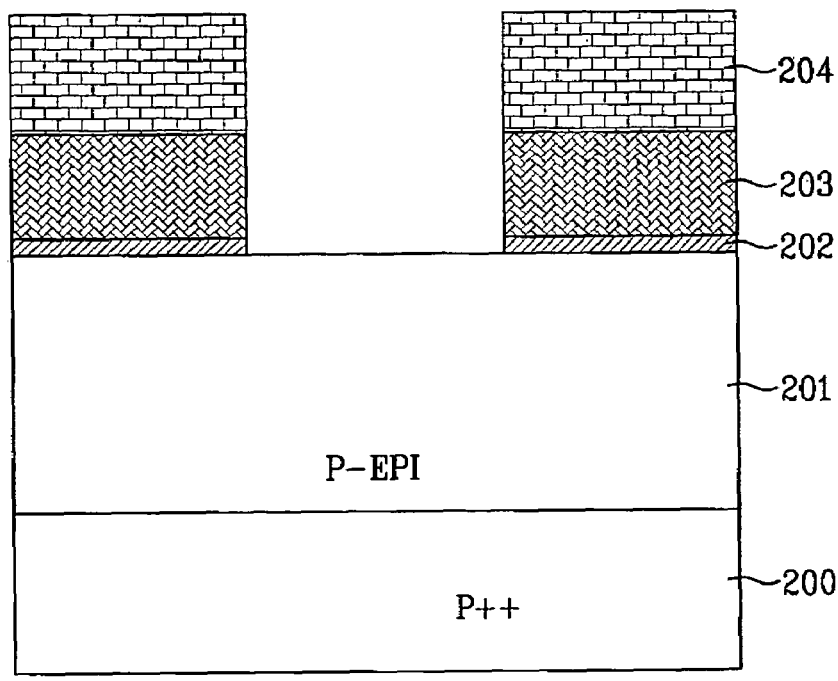
FIG. 5A to FIG. 5G are sectional views illustrating a method for fabricating a CMOS image sensor according to a second exemplary embodiment of the present invention.

As shown in FIG. 5A, a first conductive type (P⁻ type) lightly doped epitaxial layer 201 is formed on a semiconductor substrate 200 of a first conductive type (P⁺⁺ type) heavily doped monosilicon by an epitaxial process.

The epitaxial layer 201 is deeply formed to improve the capability of a low voltage photodiode for collecting optical charges by deeply forming a depletion region in the photodiode.

Subsequently, an oxide film 202 is formed on the semiconductor substrate 200 including the epitaxial layer 201, and a nitride film 203 is formed on the oxide film 202. Then, a photoresist 204 is coated on the nitride film 203 and patterned by exposing and developing processes to define a device isolation region. The nitride film 203 and the oxide film 202 are selectively etched using the patterned photoresist 204 as a mask to expose the surface of the semiconductor substrate 200.

Figure 5B:
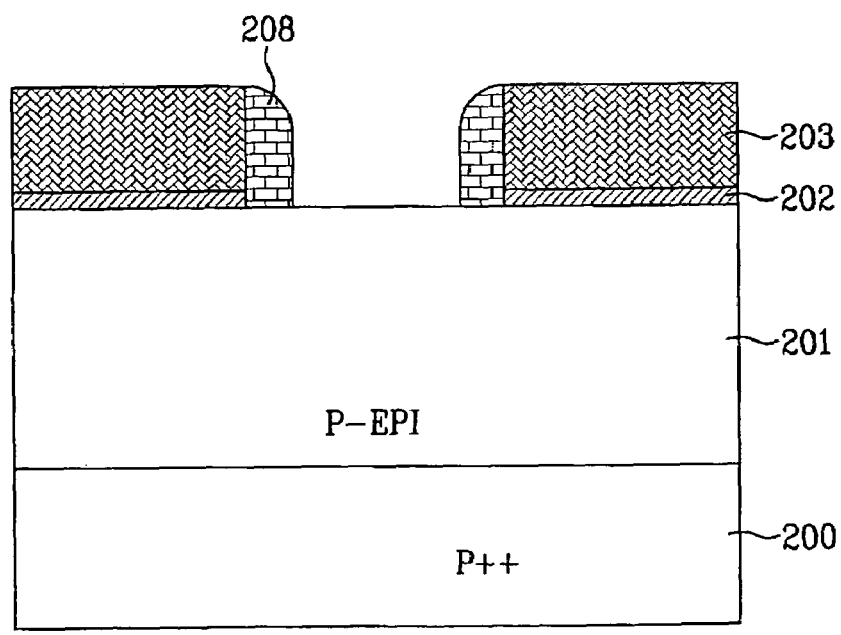

As shown in FIG. 5B, the photoresist 204 is removed, and an oxide insulating film is formed on the entire surface of the semiconductor substrate 200. Then, spacers 208 are formed at sides of the selectively removed nitride film and oxide film by an etch-back process.

Figure 5C:
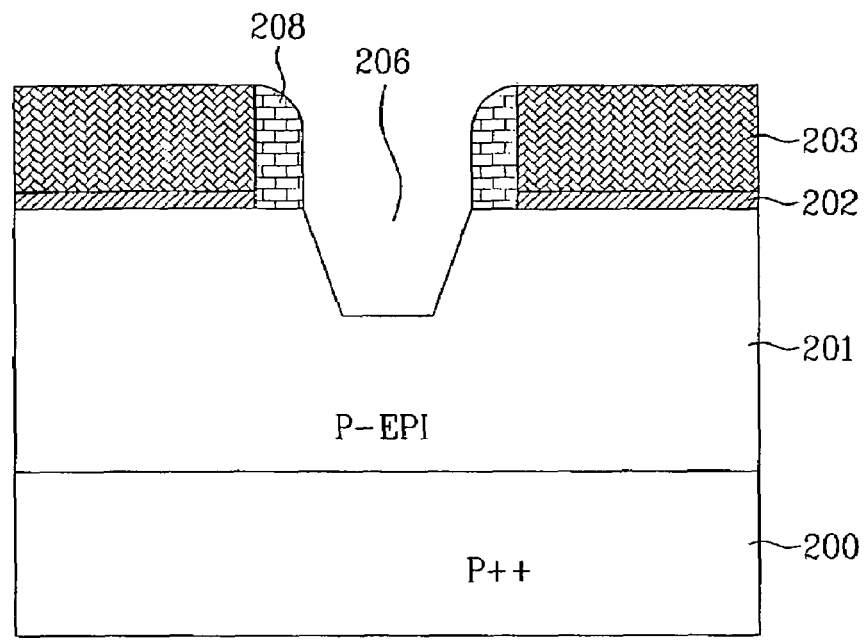

As shown in FIG. 5C, the exposed semiconductor substrate 200 is selectively etched using the nitride film 203 and the spacers 205 as masks to form a trench 206 having a predetermined depth from the surface of the semiconductor substrate 200.

Figure 5D:
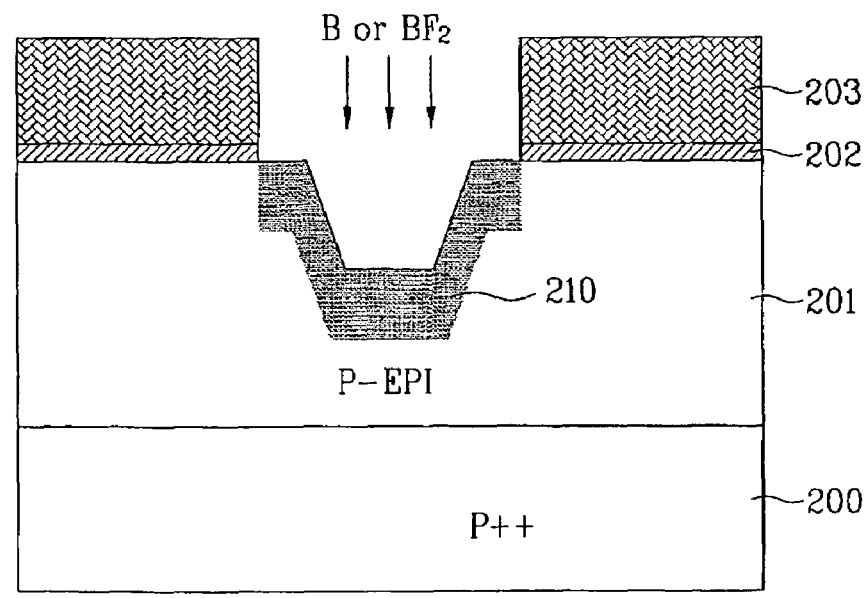
Figure 5E:
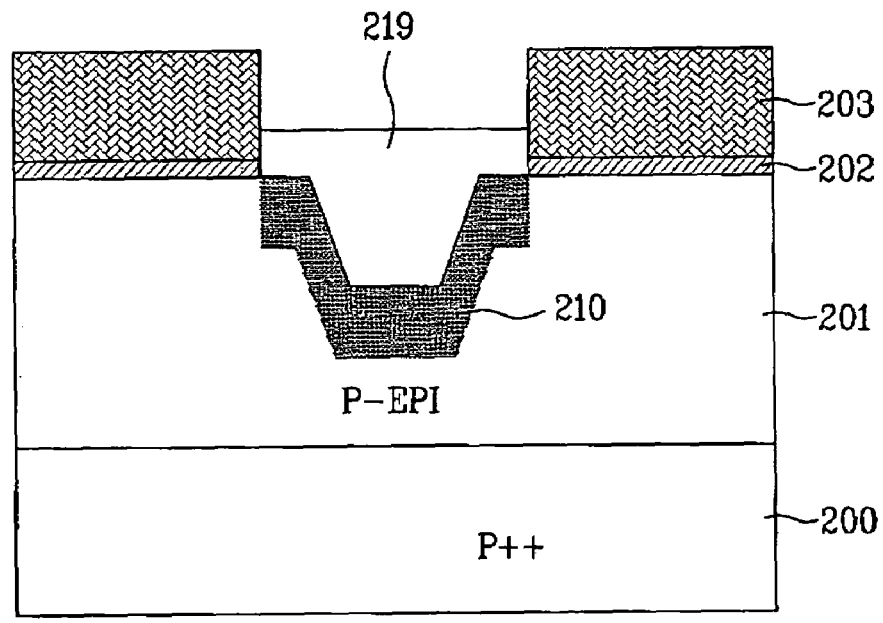
Figure 5F:
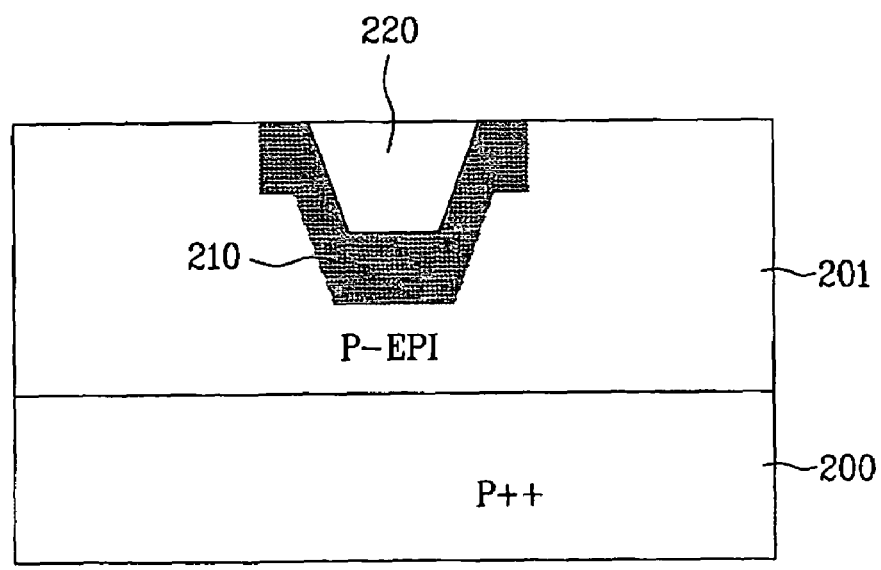
Figure 5G:
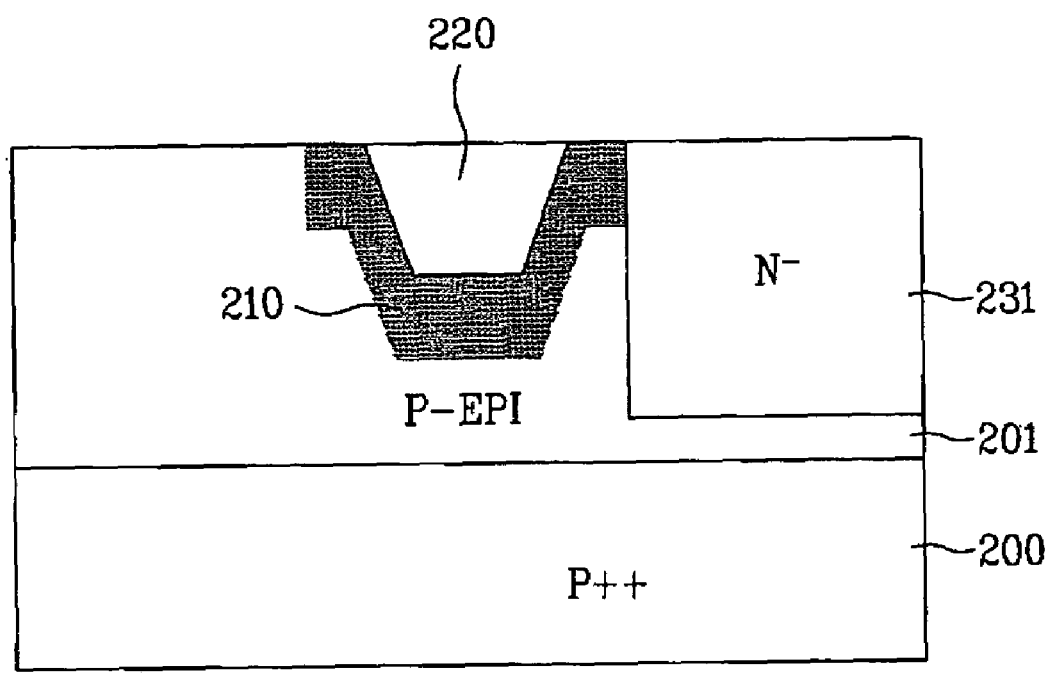

As shown in FIG. 5D, after the spacers 208 are removed, B ions or $BF_2$ ions are vertically implanted into the entire surface of the semiconductor substrate 200 using the nitride film 203 and the oxide film 202 as masks to form an ion implantation prevention layer 210 in the surface of the semiconductor substrate 200 at the trench 206.

The process steps after the ion implantation prevention layer 210 is formed in the second embodiment are the same as those of the first embodiment.

The ion implantation prevention layer is formed in the vicinity of the device isolation film to prevent the impurity ions for the photodiode from being implanted into the boundary portion between the photodiode region and the device isolation film. Therefore, it is possible to minimize the dark current generated in the boundary portion between the photodiode region and the device isolation film, thereby improving operation reliability of the CMOS image sensor.

In addition, since the impurity ions for the ion implantation prevention layer are vertically implanted into the semiconductor substrate, they are deeply implanted below trench. As such, it is possible to avoid crosstalk.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a CMOS image sensor comprising:
    sequentially forming an oxide film and a nitride film on a first conductive type semiconductor substrate having an active region and a device isolation region;
    selectively etching the nitride film and the oxide film using a mask layer to expose the device isolation region of the semiconductor substrate and form a polymer at sides of the etched nitride and oxide films;
    forming a trench on a surface of the exposed semiconductor substrate using the mask layer and the polymer as masks;
    removing the mask layer and the polymer;
    forming an ion implantation prevention layer in the surface of the semiconductor substrate in which the trench is formed by implanting first conductive type impurity ions into the surface of the semiconductor substrate using the nitride film and the oxide film as masks, wherein the first conductive type impurity ions are vertically implanted into the device isolation region such that the ion implantation prevention layer has a layer at a bottom of the trench that is thicker than a layer along sidewalls of the trench;
    forming a device isolation film in the trench;
    removing the nitride film and the oxide film; and
    forming a second conductive type diffusion region in the active region of the semiconductor substrate to be separated from the device isolation film by the ion implantation prevention layer.

2. The method according to claim 1, wherein the polymer is formed by etching the nitride film using a $CF_4$ gas.

3. The method according to claim 1, wherein the polymer has a thickness of about 200 Å to about 500 Å.

4. The method according to claim 1, wherein the first conductive type impurity ions implanted to form the ion implantation prevention layer are at least one of B ions or $BF_2$ ions.

5. The method according to claim 1, further comprising forming an oxide film in a surface of the trench.

6. The method according to claim 1, further comprising forming a first conductive type diffusion region on the second conductive type diffusion region.

7. A method for fabricating a CMOS image sensor comprising:

sequentially forming an oxide film and a nitride film on a first conductive type semiconductor substrate having an active region and a device isolation region;

selectively etching the nitride film and the oxide film to expose the device isolation region of the semiconductor substrate;

forming spacers at sides of the nitride and oxide films;

forming a trench on a surface of the exposed semiconductor substrate using the nitride film and the spacers as masks;

removing the spacers;

forming an ion implantation prevention layer in the surface of the semiconductor substrate in which the trench is formed by implanting first conductive type impurity ions into the surface of the semiconductor substrate using the nitride film and the oxide film as masks, wherein the first conductive type impurity ions are vertically implanted into the device isolation region such that the ion implantation prevention layer has a layer at a bottom of the trench that is thicker than a layer along sidewalls of the trench;

forming a device isolation film in the trench;

removing the nitride film and the oxide film; and forming a second conductive type diffusion region in the active region of the semiconductor substrate to be separated from the device isolation film by the ion implantation prevention layer.

8. The method according to claim 7, wherein the step of forming spacers includes:

forming an oxide insulating film on the surface of the semiconductor substrate including the nitride film; and etching back the oxide insulating film to form the spacers.

9. The method according to claim 7, wherein the first conductive type impurity ions implanted to form the ion implantation prevention layer are at least one of B ions and $BF_2$ ions.

10. The method according to claim 7, further comprising forming an oxide film in a surface of the trench.

11. The method according to claim 7, further comprising forming a first conductive type diffusion region on the second conductive type diffusion region.

* * * * *